(12) United States Patent
     Li

(10) Patent No.: US 10,775,003 B1
(45) Date of Patent: Sep. 15, 2020

(54) LED LIGHT STRIP

(71) Applicant: GUANGDONG OML TECHNOLOGY CO., LTD, Zhongshan, Guangdong (CN)

(72) Inventor: Xiaoping Li, Guangdong (CN)

(73) Assignee: GUANGDONG OML TECHNOLOGY CO., LTD, Zhongshan (CN)

( * ) Notice: Subject to any disclaimer, the term of this patent is extended or adjusted under 35 U.S.C. 154(b) by 0 days.

(21) Appl. No.: 16/398,305

(22) Filed: Apr. 30, 2019

(51) Int. Cl.
    *F21S 4/22*     (2016.01)
    *F21S 4/24*     (2016.01)
    *H01L 33/58*    (2010.01)
    *H01L 33/52*    (2010.01)
    *H05B 45/395*   (2020.01)

(52) U.S. Cl.
    CPC ............... *F21S 4/22* (2016.01); *H01L 33/52* (2013.01); *H01L 33/58* (2013.01); *H05B 45/395* (2020.01)

(58) Field of Classification Search
    CPC ....................................................... F21S 4/22
    See application file for complete search history.

(56) References Cited

U.S. PATENT DOCUMENTS 8,461,602 B2 *  6/2013  Lerman .............. H01L 25/0753
                                                    257/88
2016/0091178 A1 *  3/2016  Alfier .................... F21V 3/0625
                                                    362/223

FOREIGN PATENT DOCUMENTS

CN          104333958 A  *  2/2015

OTHER PUBLICATIONS

Machine Translation of CN104333958, Feb. 2015.*

* cited by examiner

*Primary Examiner* — Joseph L Williams
*Assistant Examiner* — Jacob R Stern

(57) ABSTRACT

The present invention relates to an LED light strip, comprising a flexible protective sleeve, a soft light panel and a reinforcing board, said soft light panel being provided with a protective circuit, and said soft light panel comprising a first insulating soft film, an LED light source and a second insulating soft film arranged in sequence. The protective circuit is provided with a Zener diode or a voltage-stabilizing unit, which is connected in parallel to at least one LED light source, and is turned on when the LED light source is disconnected as to maintain the soft light panel operating. Therefore, the LED light strip of the invention continues to operate for illumination when one or more of the LED light sources are damaged thereon. Furthermore, the LED light strip of the invention is provided with a reinforcing panel to prevent circuit break inside the soft light panel.

9 Claims, 8 Drawing Sheets

US 10,775,003 B1

LED LIGHT STRIP

FIELD OF THE INVENTION

The present invention relates to LED field, specifically an LED light strip.

BACKGROUND OF THE INVENTION

As is known, an existing LED light strip generally include a flexible protective sleeve which is provided with an accommodating cavity extending along a length thereof, and a soft light panel is embedded in the accommodating cavity, said soft light panel being provided with a LED light source which emit light under electrification.

The flexible lamp board is configured to omit a copper strand conductor in a core wire in order to include a main conductor layer, and is generally configured to be wide enough or foldable. However, a soft light panel with considerable width is not favorably bendable, while a foldable soft light panel is prone to suffer power failure due to a short circuit caused by an end-cutting process thereof. Moreover, the LEDs require separate packaging, which requires a bracket to mount the LEDs on the soft light panel, and also processes with considerable complexity and poor cost effectiveness including gold wiring, reflow soldering, etc.

The flexible protective sleeve is configured to protect the soft light panel and the LED light source disposed in the accommodating cavity, thereby greatly prolonging the service life of the LED light strip and achieving a better light emission effect. An existing flexible protective sleeve is generally made of a transparent material in order to facilitate the light emitted by the LED light source to pass therethrough, while the accommodating cavity is generally made same or slightly smaller in size with the soft light panel in order to prevent the soft light panel from sliding out of the accommodating cavity. Therefore, a bottom surface of the soft light panel embedded in the accommodating cavity abuts against an inner-wall bottom face of the accommodating cavity, which causes formation of air bubbles therebetween when the soft light panel is embedded in the accommodating cavity. The above technical problem has caused that said air bubbles and even LED light sources or other electrical parts are easily seen by a user, thus significantly impairing the ornamental effect of the LED light string.

In addition, some of the existing LED light strips are each provided with a plurality of LED light sources which are arranged in series on the soft light panel thereof. Should one or more of the LED light sources are damaged, the whole LED light string will cease operating due to an open circuit. Such a liability of the existing LED light strips cripples a convenient use thereof for a user with heavy burden of maintenance or replacement.

Based on the above technical problems of the LED light strips, the development of an easily maintainable LED light strip that requires a simple manufacturing process has become an urgent demand in the LED field.

SUMMARY OF THE INVENTION

The technical goal of the present invention is to provide an LED light strip with a simple structure, which requires significantly reduced frequency of maintenance and has high durability.

Another technical goal of the present invention is to prevent air bubbles from being seen by a user, said air bubbles being those between a bottom surface of the soft light panel and an inner-wall bottom face of the accommodating cavity.

Another technical goal of the present invention is to remove said air bubbles by effective discharge thereof.

Another technical goal of the present invention is to improve the light-emitting efficiency, prevent failure of the LED light beads due to breakage of the soft light panel and so forth.

In order to solve the above technical problems, the present invention provides an LED light strip, comprising: a flexible protective sleeve, an interior of which being provided with an accommodating cavity extending along a length thereof; a soft light panel, said soft light panel being embedded in the accommodating cavity; and a reinforcing panel, said reinforcing panel being embedded in the accommodating cavity, and being bonded with the soft light panel via a fixing glue or abutting against the soft light panel in an interior of the accommodating cavity; wherein: the soft light panel comprises a first insulating soft film, a second insulating soft film and at least one LED light source, wherein the first insulating soft film and the second insulating soft film are respectively fixed to two end faces of the LED light source; the first insulating soft film or the second insulating soft film is provided with a plurality of circuit layers along a length thereof, wherein two adjacent circuit layers are connected in an end-to-end manner; the two end faces of the LED light source are respectively provided with a first chip electrode and a second chip electrode, wherein the first chip electrode is electrically connected to a tail portion of one of the circuit layers via a first pin, and the second chip electrode is electrically connected to a head portion of an adjacent circuit layer via a second pin; the first chip electrode and the first pin are electrically connected via a first conductive layer, and the second chip electrode and the second pin are electrically connected via a second conductive layer; the LED light strip further comprises a protective circuit, said protective circuit being connected in parallel to the at least one LED light source, and said protective circuit being turned on when the LED light source is disconnected to maintain the soft light panel operating; and, the reinforcing panel is a metal plate or a plastic plate.

Preferably, the protective circuit comprises a Zener diode, said Zener diode being connected in reverse parallel to the at least one LED light source, and a stabilized voltage of said Zener diode being greater than a terminal voltage at which the at least one LED light source connected in reverse parallel to the Zener diode operates.

Preferably, the LED light strip comprises at least two LED light source groups, said LED light source group consisting of at least one LED light source; the protective circuit comprises a voltage-stabilizing unit, an A-terminal of said voltage-stabilizing unit being respectively connected to a cathode of one of the LED light source groups and an anode of another LED light source group, a B-terminal of said voltage-stabilizing unit being connected to an anode of one of the LED light source groups, and a C-terminal of said voltage-stabilizing unit being connected to a cathode of another LED light source group.

Preferably, the voltage-stabilizing unit comprises a first Zener diode and a second Zener diode connected in series with each other, a cathode of said first Zener diode being connected to an anode of one of the LED light source groups, an anode of said second Zener diode being connected to a cathode of another LED light source group, and an anode of said first Zener diode being connected to a cathode of said second Zener diode and simultaneously connected to a cathode of one of the LED light source groups and an anode of another LED light source group.

Preferably, the LED light strip further comprises a current-limiting circuit, said current-limiting circuit being connected in series to the LED light source.

Preferably, the first insulating soft film and the second insulating soft film are each an elongated structure, and a plurality of circuit layers are provided on the second insulating soft film in equidistant intervals, wherein two adjacent circuit layers are electrically connected via one LED light source to form an LED light string connected in series.

Preferably, the light strip further comprises a third insulating soft film, said third insulating soft film being provided on an outer-side of the second insulating soft film; and, two main conductor layers, said two main conductor layers being provided between the second insulating soft film and the third insulating soft film, being electrically connected to a head and a tail of the LED string, and being fixed with the second insulating soft film and the third insulating soft via a insulating glue.

Preferably, a bottom of the flexible protective sleeve is provided with an opening which is communicating with the accommodating cavity, said opening being provided with an opaque baffle which is capable of blocking the opening; and, an inner-wall bottom face of the accommodating cavity is provided with at least one stripe groove which is extending along a length of the flexible protective sleeve.

Preferably, the LED light source comprises at least one LED chip, an encapsulant encapsulating the LED chip, and a first optical layer arranged between the LED chip and the encapsulant, said first optical layer having a refractive index of 1.6-2.0; and, a surface of the flexible protective sleeve is provided with a second optical layer, said second optical layer having a refractive index of 1.2-1.4.

Preferably, the first optical layer is a transparent ceramic film, preferably a transparent aluminum oxide film or a transparent aluminum nitride film; and, the second optical layer is one or both of a lithium fluoride film or a magnesium fluoride film.

The present invention has the following advantages:

The present invention provides a uniquely structured soft light panel with high compactness and flexibility, which allows the soft light panel to be bendable for use. Moreover, the present invention further provides a protective circuit for replacing damaged LED light source(s) in case of such, thereby maintaining electrification and light emission. Therefore, the above configuration endows the LED light string with a remarkably prolonged service life and strong durability.

In addition, a bottom of the flexible protective sleeve of the present invention is provided with an opening that communicates with the accommodating cavity, while an opaque baffle that is capable of blocking the opening is provided at the opening. In such a way, the opaque baffle blocks the soft light panel which is embedded in the accommodating cavity, thereby, for an ornamental effect, preventing the air bubbles between a bottom surface of the soft light panel and an inner-wall bottom surface of the accommodating cavity from being seen by a user.

In the present invention, an inner-wall bottom face of the accommodating cavity is provided with at least one stripe groove which is extending along a length of the flexible protective sleeve. In such a way, when the flexible light panel is embedded in the accommodating cavity, at least one stripe groove is arranged between the bottom surface of the soft light panel and the inner-wall bottom surface of the accommodating cavity, thereby, for an ornamental effect, preventing the formation of said air bubbles by discharging them to the outer side of the accommodating cavity through the stripe groove.

Meanwhile, a reinforcing panel for the soft light panel is provided in an interior of the accommodating cavity, thus increasing the tensile strength of the LED light, and thereby improving the reliability of the LED light strip by advantageously avoiding circuit break in the soft light panel due to stretching during the installation process of the LED light strip.

The present invention also provides a first and a second optical layer to gradually reduce the refractive indexes of the media through which the light travels, thereby improving the light emission efficiency of the LED light strip by avoiding total light reflection. On the other hand, since the emitted light is refracted from a medium with a higher refractive index to a medium with a lower refractive index, the angle of exit of the emitted light increases during its emission through these different media, thereby increasing the uniformity of light emission.

Figure 1:
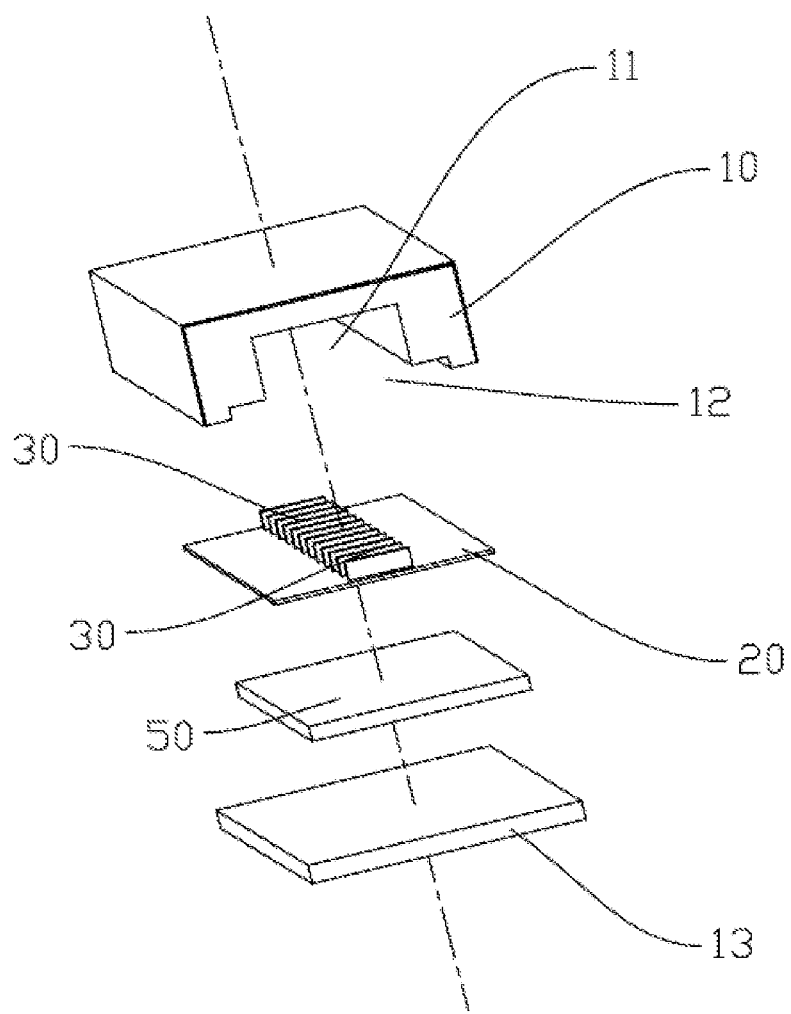
FIG. 1 is an exploded view of an LED light strip in a first embodiment of the present invention.

LIST OF REFERENCE NUMERALS 10. flexible protective sleeve
11. accommodating cavity
110. stripe groove
12. opening
13. baffle
20. soft light panel
21. first insulating soft film
22. second insulating soft film
23. circuit layer
230. first aperture
24. optical glue
25. third insulating soft film
26. main conductor layer
260. second aperture
30. LED light source 31. first pin
310. first conductive layer
32. second pin
320. second conductive layer
33. LED chip
34. encapsulant
35. first optical layer
40. protective circuit
50. reinforcing panel
60. second optical layer

DETAILED DESCRIPTION OF ILLUSTRATED EMBODIMENTS

The present invention will be further described in conjunction with the drawings for a purpose of clarifying the goals, technical solutions and advantages thereof. In this regard, the terms "up/upper/above", "low/lower/beneath", "left", "right", "front", "rear/back", "inside/inner side", "outside/outer side" and the like used herein are only based on the drawings with no attempt to limit the scope of the present invention.

As shown in FIG. 1, the LED light strip of the present invention includes a flexible protective sleeve 10, a soft light panel 20 and a reinforcing panel 50, an interior of said flexible protective sleeve 10 being provided with an accommodating cavity 11 extending along a length thereof, and said soft light panel 20 and said reinforcing panel 50 being embedded in said accommodating cavity 11.

Figure 2:
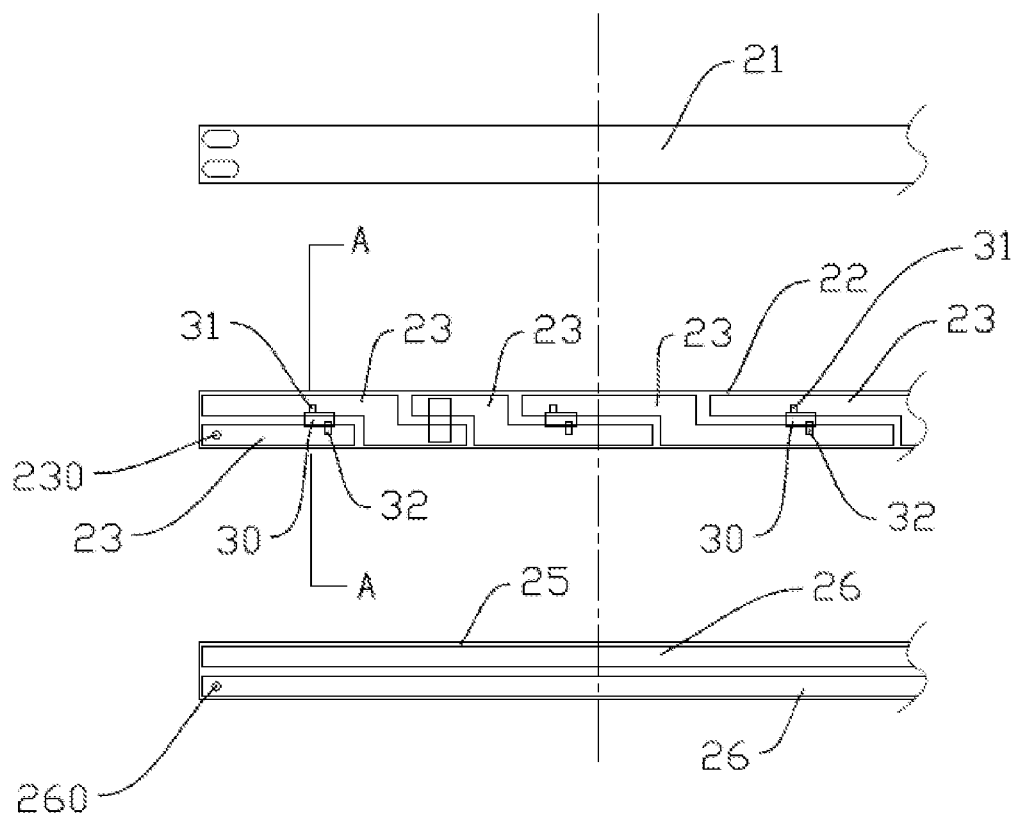
FIG. 2 is a schematic structural exploded view of a soft light panel of the present invention.
Figure 3:
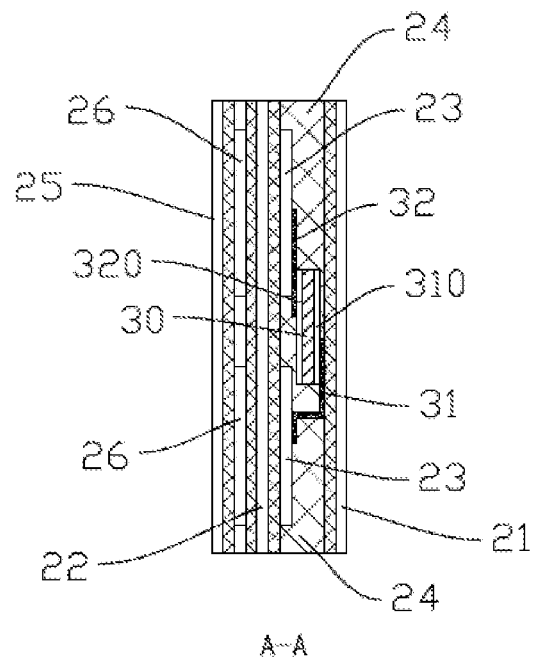
FIG. 3 is a cross-sectional view along line A-A of FIG. 1.

As shown in FIGS. 2-3, in order to simplify the manufacture of the LED light strip and to improve the production efficiency thereof, the soft light panel of the present invention includes a first insulating soft film 21, a second insulating soft film 22 and an LED source 30, said first insulating soft film 21 and said second insulating soft film 22 being respectively fixed to two end faces of the LED light source 30. The first insulating soft film 21 or the second insulating soft film 22 is provided with a plurality of circuit layers 23 on its surface along a length thereof, said circuit layers 23 being independent of each other and being arranged successively, and two adjacent circuit layers 23 being connected with each other via an LED light source 30. The two end faces of the LED light source 30 are respectively provided with a first chip electrode and a second chip electrode, said first chip electrode being electrically connected to one of the two adjacent circuit layers 23 via a first pin 31, and said second chip electrode being electrically connected to the other one of the two adjacent circuit layers 23 via a second pin 32. The first chip electrode and the first pin 31 are electrically connected via a first conductive layer 310, and the second chip electrode and the second pin 32 are electrically connected via a second conductive layer 320. The first conductive layer 310 are electrically connected to the first chip electrode and the first pin 31 via a conductive glue, and the second conductive layer 320 are electrically connected to the second chip electrode and the second pin 32 via a conductive glue.

Therefore, given the fact that the above configuration is adopted by the soft light panel 20, the flexible lamp panel 20 is endowed with structural compactness and high flexibility, thereby allowing it to be bendable for use.

Figure 4:
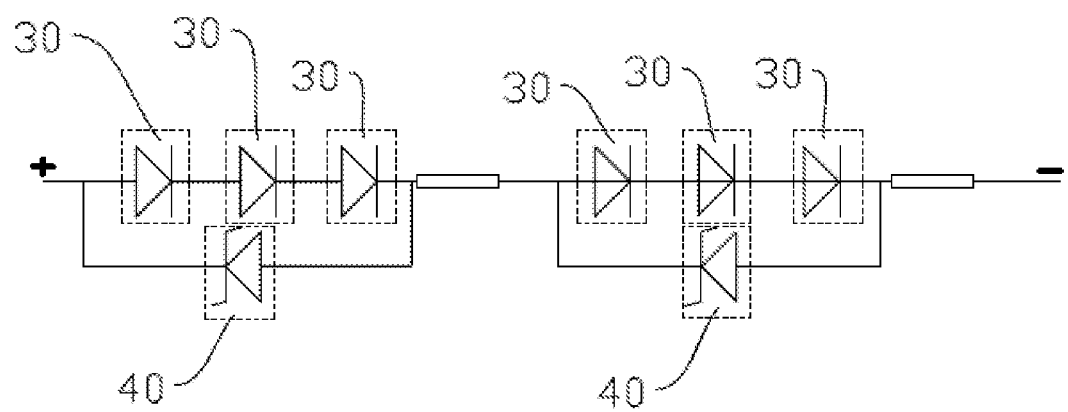
FIG. 4 is a schematic view showing a circuit structure of a soft light panel in an embodiment of the present invention.
Figure 5:
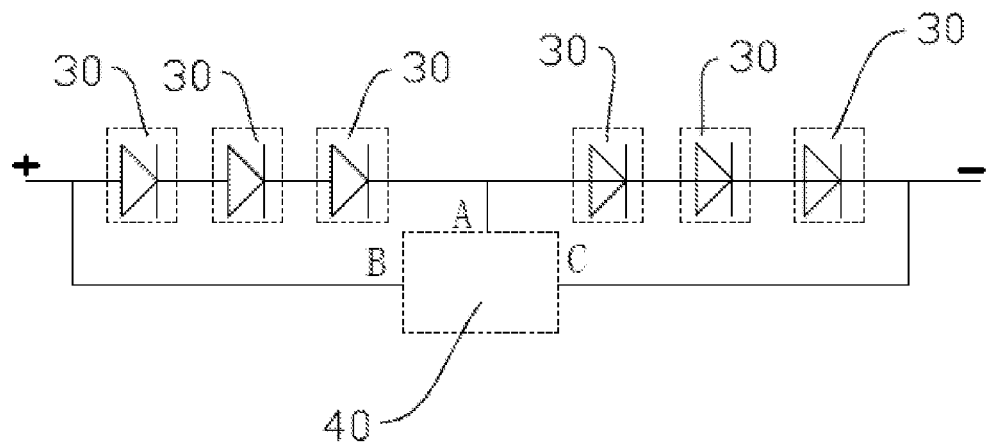
FIG. 5 is a schematic view showing a circuit structure of a soft light panel in another embodiment of the present invention.
Figure 6:
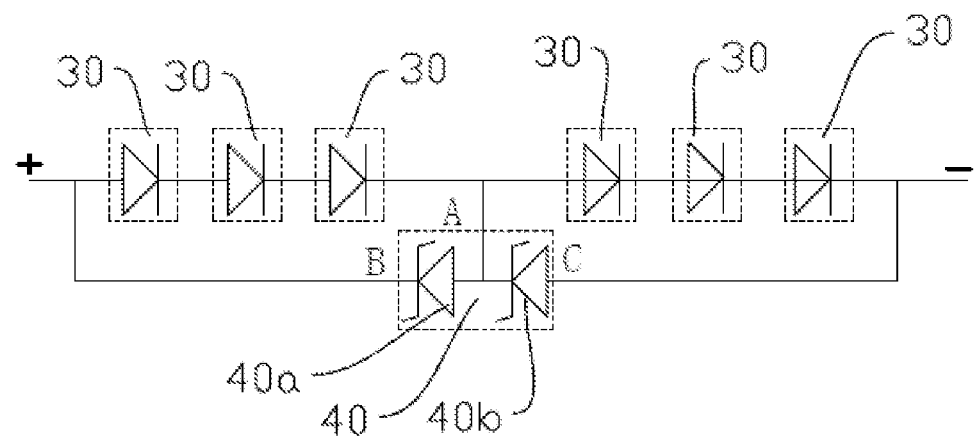
FIG. 6 is a schematic view showing a circuit structure of a soft light panel in another embodiment of the present invention.

As shown in FIGS. 4-6, the present invention further provides a protective circuit 40 which is connected in parallel to at least one LED light source. The protective circuit 40 is turned on when the LED light source 30 is disconnected to maintain the soft light panel operating, namely, the protective circuit 40 replaces the damaged LED light sources in case of such, thereby maintaining electrification and light emission. Therefore, the above configuration endows the LED light string with a remarkably prolonged service life and strong durability.

As shown in FIG. 4, the protective circuit 40 in one embodiment includes at least one Zener diode, said Zener diode being connected in reverse parallel to at least one LED light source, and a stabilized voltage of said Zener diode being higher than aterminal-voltage at which the at least one LED light source connected in reverse parallel to the Zener diode operates. As shown in FIG. 4, the protective circuit 40 of this embodiment includes two Zener diodes, while the number of the Zener diodes is also adjustable as the length of the light strip increases. Each Zener diode is connected in reverse parallel to three LED light sources 3, wherein a stabilized voltage of the Zener diode is Ud, and a voltage across both ends of the three LED light source is Ua, Ud being slightly higher than Ua. Since Ua is lower than Ud, the Zener diode is in a non-electrified state, and a circuit connected in parallel with the Zener diode is in an open state when any LED light source 30 is damaged. At the instant of opening, a voltage across both ends of the Zener diode is equal to a voltage of the power supply, and since the latter is higher than the stabilized voltage Ud of the Zener diode, the Zener diode is reversely punctured and then electrified. The above configuration allows the Zener diode to form a circuit loop by being connected in series with the remaining LED light sources 30, thereby advantageously maintaining the remaining LED light sources 30 usable, reducing need for maintenance and providing an excellent overall durability.

As shown in FIG. 5, the protective circuit 40 in another embodiment includes at least two LED light source groups, each of which consists of at least one LED light source 30. The protective circuit 40 includes a voltage-stabilizing unit, an A-terminal of said voltage-stabilizing unit being connected to a cathode of one of the LED light source groups and an anode of another one of the LED light source groups, a B-terminal of said voltage-stabilizing unit being connected to an anode of one of the LED light source groups, and a C-terminal of said voltage-stabilizing unit being connected to a cathode of another one of the LED light source groups. The above configuration maintains the voltage-stabilizing unit electrified when any LED light source group is disconnected, thereby allowing the entire circuit to continue operating.

As shown in FIG. 6, the voltage-stabilizing unit of the protective circuit 40 in another embodiment includes a first Zener diode 40a and a second Zener diode 40b which are connected in series with each other, a cathode of said first Zener diode 40a (i.e., the B-terminal of the voltage-stabilizing unit) being connected to an anode of one of the LED light source groups, an anode of said second Zener diode 40b (i.e., the C-terminal of the voltage-stabilizing unit) being connected to a cathode of another one of the LED light source groups. An anode of the first Zener diode 40a is connected to a cathode of the second Zener diode 40b (forming the A-terminal of the voltage-stabilizing unit), and is simultaneously connected to a cathode of one of the LED light source groups and an anode of another one of the LED light source groups.

In addition, as shown in FIG. 4, the present invention further provides a current-limiting circuit which is connected in series with the LED light source 30, a current-limiting circuit herein being a current-limiting resistor. The current-limiting resistor reduces the current flowing through the LED light source 30 to ensure a safe and stable operation of the LED Light source 30.

Preferably, for a purpose of simplifying and facilitating the manufacture of the soft light panel 20, the first and second conductive layers 310/320 and the first and second insulating soft films 21/22 are all made of a transparent or translucent material. The first conductive layer 310 is made of a heat conductive material to transfer the heat generated by the LED light source 30 to the first insulating soft film 21 or to an exterior.

Preferably, the first conductive layer 310 and the second conductive layer 320 are both made of graphene or ITO. In this embodiment, the first conductive layer 310 and the second conductive layer 320 are both grapheme, said grapheme being optionally a single layer of graphene or a plurality of layers of graphene. The conductive layers made of graphene have a high conductivity and can serve as a conductive path. Meanwhile, the graphene layer has a light transmittance of up to 97.7%, which advantageously improves light emission efficiency. An optical glue 24 for encapsulating the LED light source 30 is filled between the first insulating soft film 21 and the second insulating soft film 22, said optical glue 24 being a glue with high transmittance which further improves the light emission efficiency of the LED light source 30. The optical glue 24 is connected via an insulating glue to both the first insulating soft film 21 and the second insulating soft film 22.

The first insulating soft film and the second insulating soft film are each an elongated structure, and a plurality of circuit layers are provided on the second insulating soft film in equidistant intervals, wherein two adjacent circuit layers are electrically connected via the at least one LED light source to form an LED light string connected in series.

The first insulating film 21 and the second insulating film 22 are each an elongated structure, and a plurality of circuit layers 23 are provided on the second insulating soft film 22 in equidistant intervals, wherein two adjacent circuit layers 23 are electrically connected via one LED light source 30 to make these LED light sources 30 form an LED light string connected in series.

The soft light panel 20 of the present invention further includes a third insulating soft film 25 arranged on an outer side of the second insulating film soft 22, and two main conductor layers 26 arranged between the second insulating soft film 22 and the third insulating soft film 25. The two main conductor layers 26 are electrically connected to two ends of the LED light string respectively, and are fixed with the second insulating soft film 22 and the third insulating soft film 25 via an insulating glue.

In this embodiment, the circuit layers 23 at both ends of the LED light string are provided a first aperture 230 for conducting electricity, and the two main conductor layers 26 are provided with a second aperture 260 opposite to the first aperture 230, said first aperture 230 and said second aperture 260 being electrically connected via solder.

Figure 7:
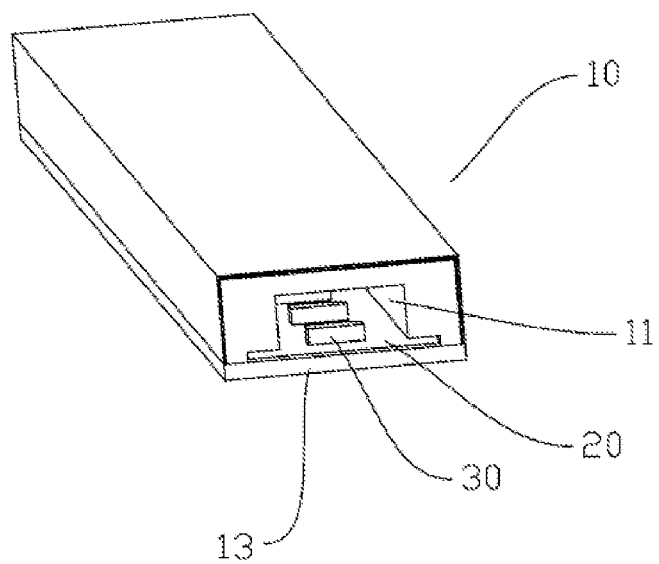
FIG. 7 is a schematic structural view of the LED light strip in the first embodiment of the present invention.
Figure 8:
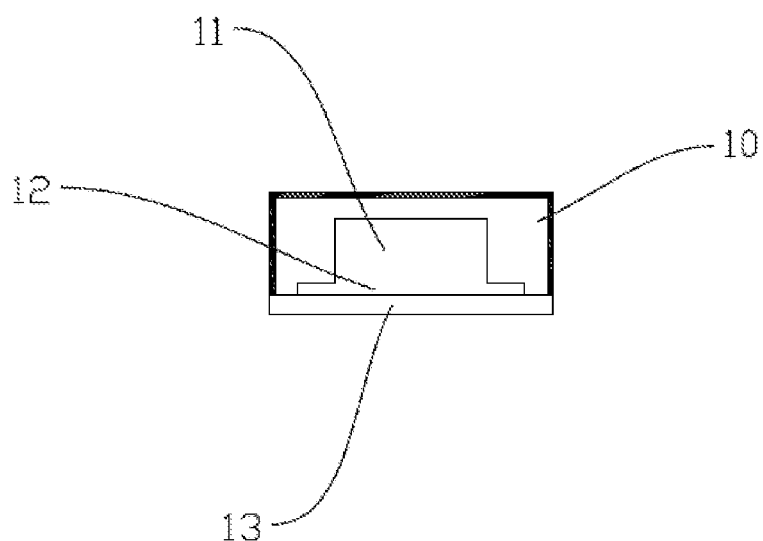
FIG. 8 is a lateral view of a flexible protective sleeve in the first embodiment of the present invention.
Figure 9:
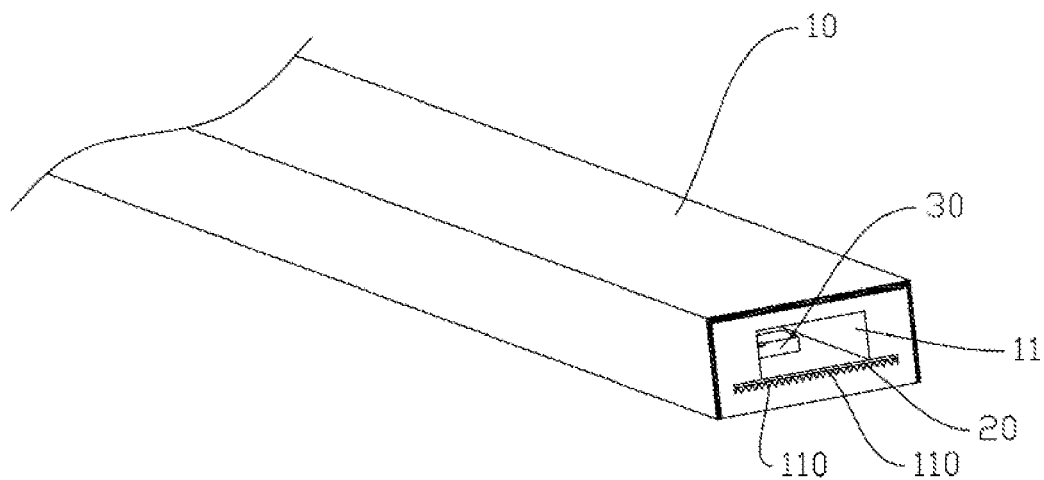
FIG. 9 is a schematic structural view of an LED light strip in a second embodiment of the present invention.
Figure 10:
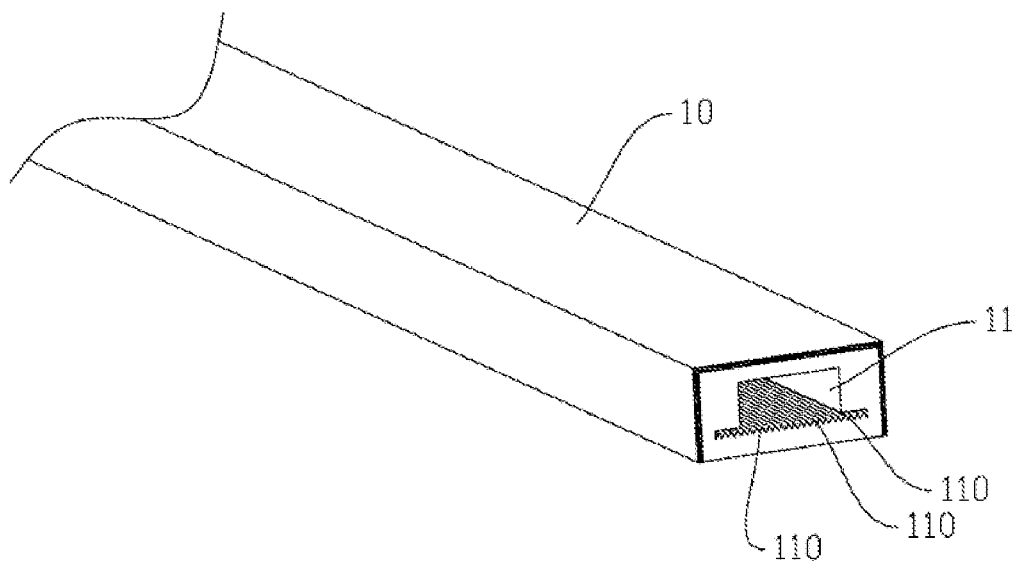
FIG. 10 is a parts drawing of the flexible protective sleeve of FIG. 9.
Figure 11:
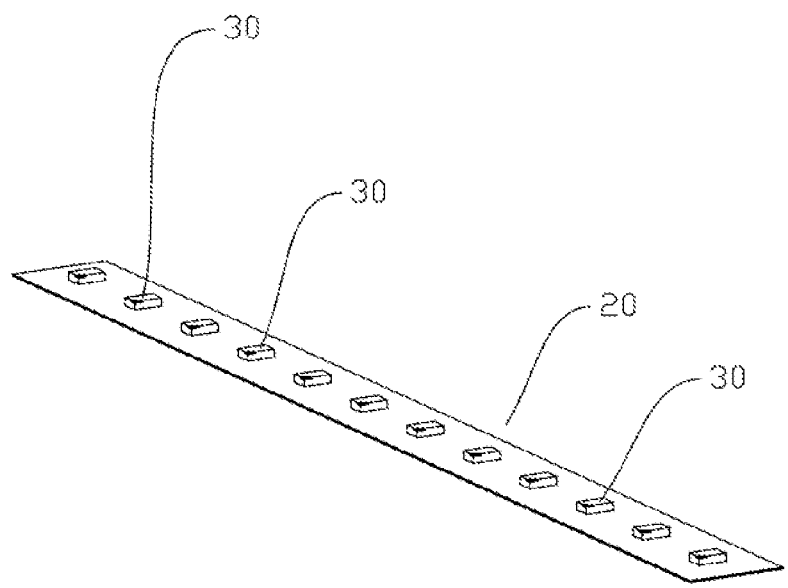
FIG. 11 is a parts drawing of the soft light panel of FIG. 9.
Figure 12:
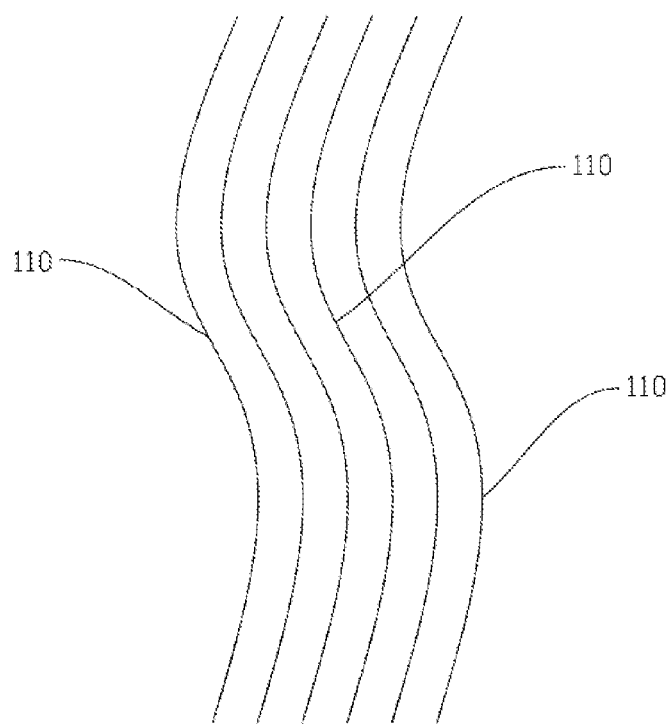
FIG. 12 is a schematic view showing a shape of a stripe groove of FIG. 9.

As shown in FIG. 1 and FIGS. 7-8, the LED light strip of the present embodiment includes a flexible protective sleeve 10, an interior of which being provided with an accommodating cavity 11 extending along a length thereof. A soft light panel 20 is embedded in the accommodating cavity 11, and is provided with a plurality of LED light sources 30 thereon, said LED light sources 30 being arranged in series on the soft light panel 20. A bottom of the flexible protective sleeve 10 is provided with an opening 12 which is communicating with the accommodating cavity 11, said opening 12 being provided with an opaque baffle 13 which is capable of blocking the opening 12.

Preferably, for a purpose of facilitating the manufacture and processing of the flexible protective sleeve 10, the flexible protective sleeve 10 is a transparent silicone sleeve, and the baffle 13 is a sanded silicone plate. Therefore, the flexible protective sleeve 10 and the baffle 13 can be integrally processed by extrusion molding, which is followed by a sanding processing of the baffle 13 for opaqueness.

Alternatively, other structures can also be adopted to make the baffle 13 opaque apart from the sanding processing. For example, the flexible protective sleeve 10 is a transparent silicone sleeve, and the baffle 13 is a colored plate, the color being selected as one or more color from but not limited to white, black, red, yellow, green, purple, orange and blue.

In the present invention, since the bottom of the flexible protective sleeve 10 is provided with the opening 12 communicating with the accommodating cavity 11, and the opaque baffle 13 capable of blocking the opening 12 is arranged at the opening 12, the following advantages are provided: the opaque baffle 13 blocks the soft light panel 20 when the latter is embedded in the accommodating cavity 11, thereby, for an ornamental effect, preventing the air bubbles between the bottom surface of the soft light panel 20 and the inner-wall bottom surface of the accommodating cavity 11 from being seen by a user.

Moreover, for a purpose of facilitating the manufacture and processing of the LED light strip of the present invention, the flexible protective sleeve 10 and the baffle 13 are preferably an integral structure, namely, the flexible protective sleeve 10 and the baffle 13 can be manufactured via integral injection molding or extrusion molding.

Alternatively, the flexible protective sleeve 10 and the baffle 13 can also be arranged as two independent parts, so that the baffle 13 is removably mounted at the opening 12 of the accommodating cavity 11. In order to allow the baffle 13 to be better mounted at the opening 12 of the accommodating cavity 11, the baffle 13 is preferably fixed to the opening 12 of the accommodating cavity 11 via a glue. Alternatively, the baffle 13 can also be wrapped at the opening 12 of the accommodating cavity 11 via a transparent tape, specific way to mount the baffle 13 being variable according to actual needs.

Correspondingly, in order to allow the soft light panel 20 to be better fixated in the accommodating cavity 11, the accommodating cavity 11 in a preferred embodiment is shaped convex in a cross section, the soft light panel 20 being embedded in a lower portion thereof, and the LED light source 30 being embedded in an upper portion of thereof. The convex shape allows the soft light panel 20 and the LED light source 30 to be better fixated, and thus preventing the soft light panel from shaking in relative to the flexible protective sleeve 10.

As shown in FIGS. 9-12, the LED light strip of the present embodiment includes a flexible protective sleeve 10, an interior of said flexible protective sleeve 10 being provided with an accommodating cavity 11 in which a soft light panel 20 is embedded. The flexible light board 20 is provided with a plurality of LED light sources 30 arranged in series thereon. In the present invention, an inner-wall bottom face of the accommodating cavity 11 is provided with at least one stripe groove 110 which is extending along a length of the flexible protective sleeve 10.

In order to facilitate the light emitted by the LED light source 30 to better pass through the flexible protective sleeve 10 and to facilitate the production and manufacture of the flexible protective sleeve 10, the flexible protective sleeve 10 is preferably a transparent protective sleeve.

Since the inner-wall bottom face of the accommodating cavity 11 is provided with at least one stripe groove 110 which is extending along a length of the flexible protective sleeve 10, at least one stripe groove 110 is arranged between the bottom surface of the soft light panel 20 and the inner-wall bottom face of the accommodating cavity 11 when the soft light panel 20 is embedded in the accommodating cavity 11. The above configuration allows the air between the bottom surface of the soft light panel 20 and the inner-wall bottom face of the accommodating cavity 11 to be removed via the stripe groove 110 to the exterior of the accommodating cavity 11, thereby effectively preventing air bubbles from forming therebetween for an ornamental effect.

Therefore, in order to allow said air to be better removed, the inner-wall bottom face of the accommodating cavity 11 is preferably provided with a plurality of stripe grooves 110, said stripe grooves 110 being uniformly arranged therealong. More preferably, the stripe groove 110 is a straight-stripe groove, a plurality of which are arranged in parallel along a length of the flexible protective sleeve 10. The above configuration further provides a stripe pattern of the bottom surface of the LED light stripe for an ornamental effect. Alternatively, the stripe groove 110 may be provided in other shapes, such as an s-shape (see FIG. 11). Therefore, the above configuration provides an ornamental effect achieved not only by removal of air bubbles, but also by choices for various stripe patterns based on the demand of a user.

For a purpose of facilitating the manufacture of the flexible protective sleeve 10, the stripe groove 110 of the present invention is preferably v-shaped in a cross section. Alternatively, the cross-sectional shape of the strip groove 110 is also variable (e.g., a u-shape).

Furthermore, in order to improve the illumination effect of the LED light strip of the present invention, the soft light panel 20 is preferably provided with a plurality of LED light sources 30 which are uniformly arranged along a length thereof.

LED light strips are generally made considerably long in length for improving the manufacture efficiency thereof, followed by a cutting of the manufactured LED light strips for suitable lengths. This however lead to a series of problems due to circuit break inside the soft light panel caused by unintentional stretching during the manufacturing process, said problems including power failure of the LED light sources, and eventually a waste of resources, production cost and installation cost. In order to solve this technical problem, the present invention further provides a reinforcing panel inside the accommodating cavity.

Figure 13:
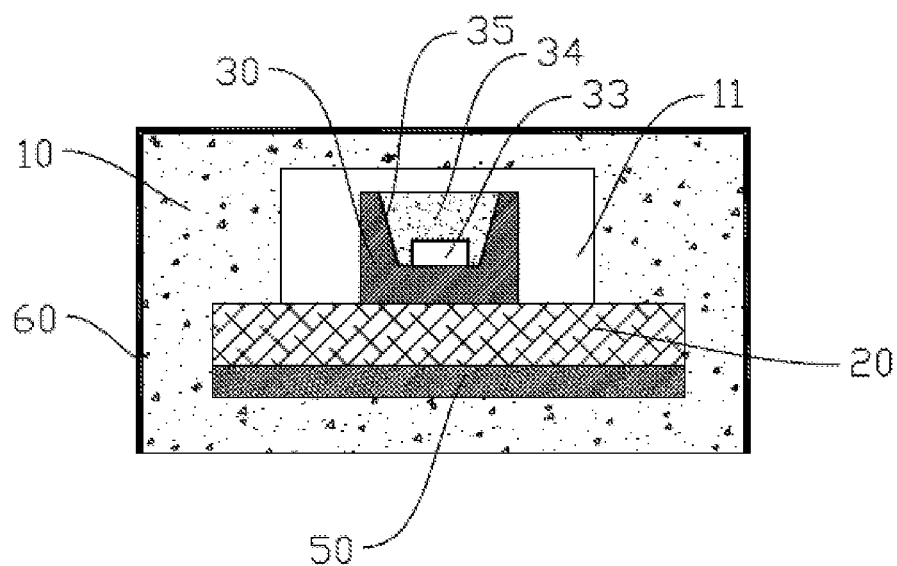
FIG. 13 is a schematic cross-sectional view of FIG. 7.

As shown in FIGS. 1, 7 and 13, the reinforcing panel 50 is in contact with one side of the soft light board 20 inside the accommodating cavity 11, said reinforcing panel 50 being fixed to the soft light board 20 via a fixing glue or being abutting against the soft light board 20 inside the accommodating cavity 11. The above configuration increases the tensile strength of the LED light strip to prevent circuit break inside the soft light panel 20 due to stretching, thereby eventually ensuring that the LED light source 30 operates normally.

Specifically, the reinforcing panel 50 can be a metal plate (e.g., aluminum, copper, etc.) or a plastic plate (e.g. PVC, silicone, PP, PS, PET, PI plate, etc.), depending on actual needs for arranging the reinforcing panel. In this embodiment, the reinforcing panel 50 is a metal plate which increases both the heat dissipation efficiency and tensile strength of the LED light strip.

It is to be noted that, existing LED chips are made of gallium nitride with a refractive index of 2.2 or higher, while the refractive indexes of the encapsulants used for packaging are usually 1.4-1.5. Encapsulants with high refractive indexes are commonly used for packaging in order to reduce light loss, a problem yet to be solved as the difference between the refractive indexes of the encapsulant and the LED chip still remains large. Further light loss also occurs when the emitted light is refracted from the encapsulanet into air as the difference in refractive index also exists for the two. As a result, the light emission efficiency of these LED light strips is considerably impaired.

In this embodiment, the LED light source 30 includes at least one LED chip 33 and an encapsulant 34 encapsulating the LED chip 33. Existing LED chips are generally made of gallium nitride with a refractive index of about 2.2, while the encapsulant has a refractive index of about 1.5. Such a gap between the refractive indexes of the two results in total reflection of the light emitted by the LED chip (i.e., the emitted light is trapped inside the LED chip), thereby impairing the light emission efficiency. To solve the above technical problem, the LED light source 30 further includes a first optical layer 35 which is arranged between the LED chip and the encapsulant, a refractive index thereof being between a refractive index of the LED chip and a refractive index of the encapsulant. Specifically, the first optical Layer 35 is a transparent ceramic film having a refractive index of 1.6-2.0, specifically 1.7, 1.8 or 1.9. In this embodiment, the transparent ceramic film is a transparent aluminum oxide film or a transparent aluminum nitride film.

In this embodiment, a transparent ceramic film having a refractive index between the refractive indexes of the LED chip 33 and the encapsulant 34 is arranged on a surface of the LED chip 33, thereby greatly improving the light emission efficiency of the LED chip 33. Secondly, given the advantage of a good compactness of the transparent ceramic film, a dense optical layer is formed between the LED chip 33 and the encapsulant 34 to prevent external moisture from entering an interior of the LED light source 30 and getting in contact with the LED chip 33, thereby prolonging the service life of the LED chip 33 and eventually that of the LED light source 30. Furthermore, since the heat dissipation efficiency of the transparent ceramic film is advantageously high, heat accumulation is prevented as the light emitted by the LED chip 33 is rapidly diffused to surrounding areas through the transparent ceramic film, thereby further prolonging the service life of the LED chip 33.

The flexible protective sleeve 10 is generally made of a transparent silicone having a low refractive index of about 1.4. Since the refractive index of air is 1, a large gap exists between the refractive indexes of the flexible protective sleeve 10 and the air, which significantly impairs the light emission efficiency of the LED light strip. In order to solve the above technical problem, the surface of the flexible protective sleeve 10 is provided with a second optical layer 60, a refractive index thereof being between the refractive indexes of the flexible protective sleeve 10 and the air, thereby improving the light transmittance of the LED light strip.

Specifically, the second optical layer 60 has a refractive index of 1.2-1.4, and is one or both of a lithium fluoride film and a magnesium fluoride film. In this embodiment, the second optical layer 60 is a lithium fluoride film with a refractive index of 1.3.

In the LED light strip provided by the present invention, the light emitted by the LED chip 33 sequentially passes through the first optical layer 35, the encapsulant, the flexible protective sleeve 10 and the second optical layer 60, refractive indexes thereof being respectively about 1.6-2.0, 1.5, 1.4 and 1.2-1.4. Namely, the refractive indexes of the media through which the emitted light passes reduce gradually, thereby avoiding a total reflection of the light, and improving the light emission efficiency of the LED light strip. On the other hand, since the emitted light is refracted from a medium having a higher refractive index to another medium having a lower refractive index, the angle of exit of the light increases during its emission through these different media, thereby increasing the uniformity of light emission.

The above are only preferred embodiments of the present invention. It is to be noted that various improvements and modifications are also both conceivable and achievable for those skilled in the art without departing from the principle of the invention, and these improvements and modifications shall also be within the scope of the present invention.

The invention claimed is:

1. An LED light strip, comprising:
a flexible protective sleeve, an interior of which being provided with an accommodating cavity extending along a length thereof;
a soft light panel, said soft light panel being embedded in the accommodating cavity; and
a reinforcing panel, said reinforcing panel being embedded in the accommodating cavity, and being bonded with the soft light panel via a fixing glue or abutting against the soft light panel in an interior of the accommodating cavity; wherein:
the soft light panel comprises a first insulating soft film, a second insulating soft film and at least one LED light source, wherein the first insulating soft film and the second insulating soft film are respectively fixed to two end faces of the LED light source, the first insulating soft film or the second insulating soft film is provided with a plurality of circuit layers along a length thereof, wherein two adjacent circuit layers are connected in an end-to-end manner; the two end faces of the LED light source are respectively provided with a first chip electrode and a second chip electrode, wherein the first chip electrode is electrically connected to a tail portion of one of the circuit layers via a first pin, and the second chip electrode is electrically connected to a head portion of an adjacent circuit layer via a second pin; the first chip electrode and the first pin are electrically connected via a first conductive layer, and the second chip electrode and the second pin are electrically connected via a second conductive layer;
the LED light strip further comprises a protective circuit, said protective circuit being connected in parallel to the at least one LED light source, and said protective circuit being turned on when the LED light source is disconnected to maintain the soft light panel operating; and
the reinforcing panel is a metal plate or a plastic plate;
the LED light strip comprises at least two LED light source groups, said LED light source group consisting of at least one LED light source, the protective circuit comprises a voltage-stabilizing unit, an A-terminal of said voltage-stabilizing unit being respectively connected to a cathode of one of the LED light source groups and an anode of another LED light source group, a B-terminal of said voltage-stabilizing unit being connected to an anode of one of the LED light source groups, and a C-terminal of said voltage-stabilizing unit being connected to a cathode of another LED light source group.

2. The LED light strip of claim 1, wherein the protective circuit comprises a Zener diode, said Zener diode being connected in reverse parallel to the at least one LED light source, and a stabilized voltage of said Zener diode being greater than a terminal voltage at which the at least one LED light source connected in reverse parallel to the Zener diode operates.

3. The LED lamp strip of claim 1, wherein the voltage-stabilizing unit comprises a first Zener diode and a second Zener diode connected in series with each other, a cathode of said first Zener diode being connected to an anode of one of the LED light source groups, an anode of said second Zener diode being connected to a cathode of another LED light source group, and an anode of said first Zener diode being connected to a cathode of said second Zener diode and simultaneously connected to a cathode of one of the LED light source groups and an anode of another LED light source group.

4. The LED light strip of claim 1, wherein the LED light strip further comprises a current-limiting circuit, said current-limiting circuit being connected in series to the LED light source.

5. The LED light strip of claim 1, wherein the first insulating soft film and the second insulating soft film are each an elongated structure, and a plurality of circuit layers are provided on the second insulating soft film in equidistant intervals, wherein two adjacent circuit layers are electrically connected via one LED light source to form an LED light string connected in series.

6. The LED light strip of claim 1, wherein the light strip further comprises
a third insulating soft film, said third insulating soft film being provided on an outer-side of the second insulating soft film; and
two main conductor layers, said two main conductor layers being provided between the second insulating soft film and the third insulating soft film, being electrically connected to a head and a tail of the LED string, and being fixed with the second insulating soft film and the third insulating soft via a insulating glue.

7. The LED light strip of claim 1, wherein a bottom of the flexible protective sleeve is provided with an opening which is communicating with the accommodating cavity, said opening being provided with an opaque baffle which is capable of blocking the opening; and
an inner-wall bottom face of the accommodating cavity is provided with at least one stripe groove which is extending along a length of the flexible protective sleeve.

8. The LED light strip of claim 1, wherein the LED light source comprises
at least one LED chip, an encapsulant encapsulating the LED chip, and a first optical layer arranged between the LED chip and the encapsulant, said first optical layer having a refractive index of 1.6-2.0; and
a surface of the flexible protective sleeve is provided with a second optical layer, said second optical layer having a refractive index of 1.2-1.4.

9. The LED light strip of claim 8, wherein the first optical layer is a transparent aluminum oxide film or a transparent aluminum nitride film; and the second optical layer is one or both of a lithium fluoride film or a magnesium fluoride film.

* * * * *